(12) United States Patent
Fujii

(10) Patent No.: US 11,225,711 B2
(45) Date of Patent: Jan. 18, 2022

(54) COATING DEVICE AND METHOD FOR MANUFACTURING COATED ARTICLE

(71) Applicant: KOBE STEEL, LTD., Hyogo (JP)

(72) Inventor: Hirofumi Fujii, Takasago (JP)

(73) Assignee: Kobe Steel, Ltd., Hyogo (JP)

( * ) Notice: Subject to any disclaimer, the term of this patent is extended or adjusted under 35 U.S.C. 154(b) by 275 days.

(21) Appl. No.: 16/483,478

(22) PCT Filed: Jan. 30, 2018

(86) PCT No.: PCT/JP2018/002837
§ 371 (c)(1),
(2) Date: Aug. 5, 2019

(87) PCT Pub. No.: WO2018/147122
PCT Pub. Date: Aug. 16, 2018

(65) Prior Publication Data
US 2020/0017956 A1 Jan. 16, 2020

(30) Foreign Application Priority Data

Feb. 9, 2017 (JP) .............................. JP2017-021968

(51) Int. Cl.
*C23C 14/34* (2006.01)
*C23C 14/50* (2006.01)
*C23C 14/32* (2006.01)
*C23C 14/54* (2006.01)
*H01J 37/32* (2006.01)
*C23C 14/06* (2006.01)
*F16J 9/26* (2006.01)

(52) U.S. Cl.
CPC .......... *C23C 14/505* (2013.01); *C23C 14/325* (2013.01); *C23C 14/34* (2013.01); *C23C 14/54* (2013.01); *H01J 37/32055* (2013.01); *C23C 14/0641* (2013.01); *F16J 9/26* (2013.01)

(58) Field of Classification Search
CPC ........... H01J 37/32055; H01J 37/32715; H01J 37/32064; C23C 14/06; C23C 14/24; C23C 14/325; C23C 14/34; C23C 14/3464; C23C 14/50; C23C 14/505; C23C 14/54; C23C 14/542; C23C 14/0641; F16J 9/26
USPC ....................................... 204/192.38, 298.41
See application file for complete search history.

(56) References Cited

U.S. PATENT DOCUMENTS

| 2004/0056425 | A1 | 3/2004 | Miida |
| 2007/0240982 | A1 | 10/2007 | Tamagaki et al. |
| 2011/0067631 | A1 | 3/2011 | Tamagaki et al. |

(Continued)

FOREIGN PATENT DOCUMENTS

JP 4680380 B2 5/2011

*Primary Examiner* — Rodney G McDonald
(74) *Attorney, Agent, or Firm* — Studebaker & Brackett PC

(57) ABSTRACT

A coating device that can control a coating thickness distribution along the circumferential direction of a work is provided. The coating device includes a work turning device that holds a plurality of works to rotate and revolve the works, a target having an emission face from which particles come out as a material of a coating formed on an outer circumferential face of each of the works, a power source that supplies an arc current to the target to cause the particles to come out of the target, and a controller that controls the power source to set the arc current in a particular period to be higher than a reference output, the particular period being at least a portion of a period in which a particular portion of the rotating work faces the emission face.

10 Claims, 13 Drawing Sheets

(56) References Cited

U.S. PATENT DOCUMENTS

| | | |
|---|---|---|
| 2013/0105298 A1 | 5/2013 | Tsunekawa et al. |
| 2016/0079045 A1 | 3/2016 | Tsunekawa et al. |
| 2017/0137931 A1 | 5/2017 | Kawamura et al. |
| 2018/0254172 A1 | 9/2018 | Tsunekawa et al. |
| 2020/0370166 A1 | 11/2020 | Kawamura et al. |

COATING DEVICE AND METHOD FOR MANUFACTURING COATED ARTICLE

TECHNICAL FIELD

The present invention relates to a coating device and a method for manufacturing a coated article.

BACKGROUND ART

Conventionally, in order to improve anti-wear property of a work, such as a piston ring of an engine, a hard coating of, for example, chromium nitride is formed on the outer circumferential face of the work by a coating method, such as PVD.

The piston ring is a metal member having a shape of a ring with a discontinuous portion. The piston ring has a pair of opposing ends opposing each other across a space which is the discontinuous portion. To use the piston ring in a cylinder of an engine, the piston ring is deformed so as to reduce the outer diameter, namely, to make the opposing ends to come close to each other, and inserted in the cylinder. When the piston ring is in use, the piston ring urging itself to open outward causes the maximum force to act on the opposing ends. That is, the opposing ends are pushed most hardly against the inner wall of the cylinder and are thus susceptible to wear during an engine operation.

In order to prevent the wear of the opposing end, it is considered to partially increase the thickness of the hard coating formed on the end.

A conventional coating method described in Patent Literature 1 is known as a coating method for forming a hard coating on a piston ring to provide a thicker hard coating on the opposing end than the hard coating on the other portion.

The coating method includes placing a piston ring on a turn table, driving the turn table by a motor to rotate and revolve the piston ring, and controlling the motor by supplying a speed-command to the motor so as to reduce the rotating-speed of the piston ring when an opposing portion of the piston ring almost faces an evaporation source. By this control, the rotating-speed of the piston ring when an opposing end of the piston ring faces the evaporation source becomes slower than when the portion other than the end faces the evaporation source. This enables forming a thicker hard coating on the end than the hard coating on the other portion.

However, in the coating method in which the motor is controlled to change the rotating-speed of the piston ring described above, there is a time lag between the timing when the speed-command is supplied to the motor and the timing when the rotating-speed of the piston ring on the turn table reaches a predetermined rotating-speed. The time lag varies during the coating processing depending on the weight of a work, such as a piston ring, the state of the turn table, and temperature. Thus, the control of the rotating-speed of the piston ring has poor repeatability. That is, it is difficult to surely control the rotating-speed of the piston ring to be slower when the opposing end of the piston ring faces the evaporation source. Accordingly, it is very difficult to accurately control the coating thickness on the end. This problem is present not only for a piston ring but also in forming a coating having a different thickness along the circumferential direction on a surface of a work.

CITATION LIST

Patent Literature

Patent Literature 1: JP 4680380 B2

SUMMARY OF INVENTION

An object of the present invention is to provide a coating device that can accurately control a coating thickness distribution along a circumferential direction of a work.

Provided is a coating device including a chamber, a work turning device that is housed in an inside of the chamber and includes at least one holder that holds at least one work and rotates the work about a predetermined rotation-axis, the work having an outer circumferential face on which a coating is to be formed, an evaporation source attached to the inside of the chamber and having an emission face from which particles come out as a material of a coating formed on the outer circumferential face of the work, a power source that supplies an electric driving output to the evaporation source to cause the particles to come out of the emission face, and a controller that controls the power source, while the work turning device rotates the work, to set the driving output supplied by the power source to the evaporation source in a particular period to an output higher than a reference output and a driving output in a period other than the particular period, the particular period being at least a portion of a period in which a particular portion of the outer circumferential face of the work faces the emission face of the evaporation source, the particular portion being where a coating thicker than the other portion of the outer circumferential face of the work is to be formed.

Also provided is a method for manufacturing a coated article, the method including a preparation step of preparing a work turning device that includes at least one holder that holds at least one work having an outer circumferential face where a coating is to be formed and rotates the work about a predetermined rotation-axis, an evaporation source having an emission face from which particles come out as a material of a coating formed on the outer circumferential face of the work, and a power source that supplies an electric driving output to the evaporation source to cause the particles to come out of the emission face, a work mounting step of mounting the work on the holder, and a coating step of forming a coating on the outer circumferential face of the work, while rotating the work by the work turning device, by controlling the power source so as to set the driving output in a particular period to be higher than a reference output and a driving output in a period other than the particular period, the particular period being at least a portion of a period in which a particular portion of the outer circumferential face of the work faces the emission face of the evaporation source, the particular portion being where a coating thicker than the other portion is to be formed, the work being formed into a coated article.

DESCRIPTION OF EMBODIMENTS

A coating device according to an embodiment of the present invention and a method for manufacturing a coated article using the coating device will be described in detail with reference to the drawings.

Figure 1:
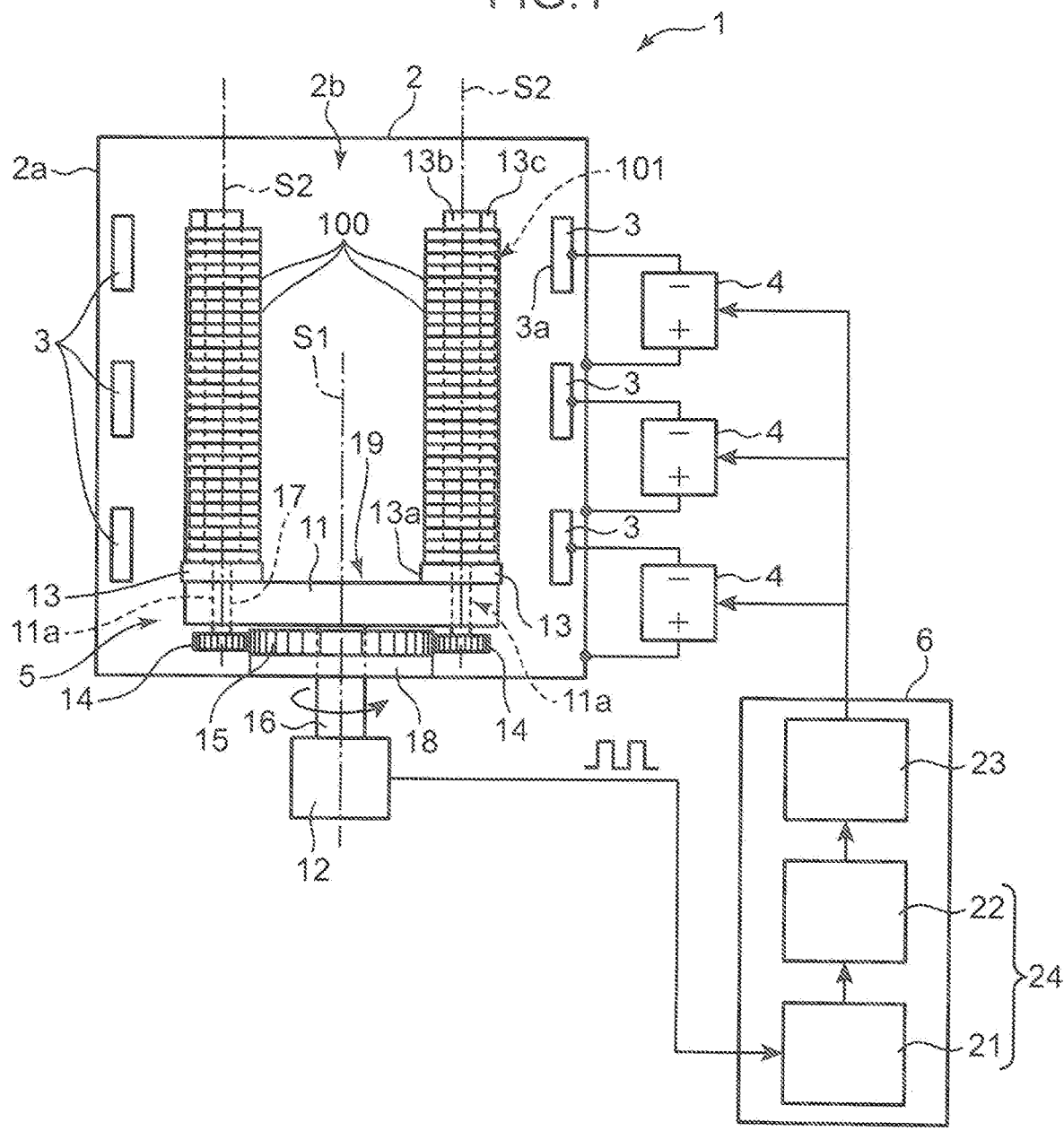
FIG. 1 is a sectional front view illustrating a general configuration of a coating device according to an embodiment of the present invention.

FIG. 1 illustrates a coating device 1 according to the embodiment. The coating device 1 performs coating processing by PVD, specifically, by arc ion plating (AIP) or spattering, on the outer circumferential face of each of a plurality of piston rings 100, or works to be coated, while rotating and revolving the piston rings 100. The coating device 1 includes a chamber 2, an evaporation source including a plurality of targets 3, a plurality of arc power sources 4 that supply an arc current to the targets 3, a work turning device 5 that rotates and revolves the piston rings 100, and a controlling device 6 that controls the current of the arc power source 4.

The chamber 2 is a hollow casing including a plurality of side walls 2a, a top wall, and a bottom wall, the top wall being joined to the upper sides of the side walls 2a and the bottom wall being joined to the lower sides of the side walls 2a. The side walls 2a, the top wall, and the bottom wall surround a sealed space 2b. The chamber 2 houses the piston rings 100 and the work turning device 5 in the space 2b.

Figure 2:
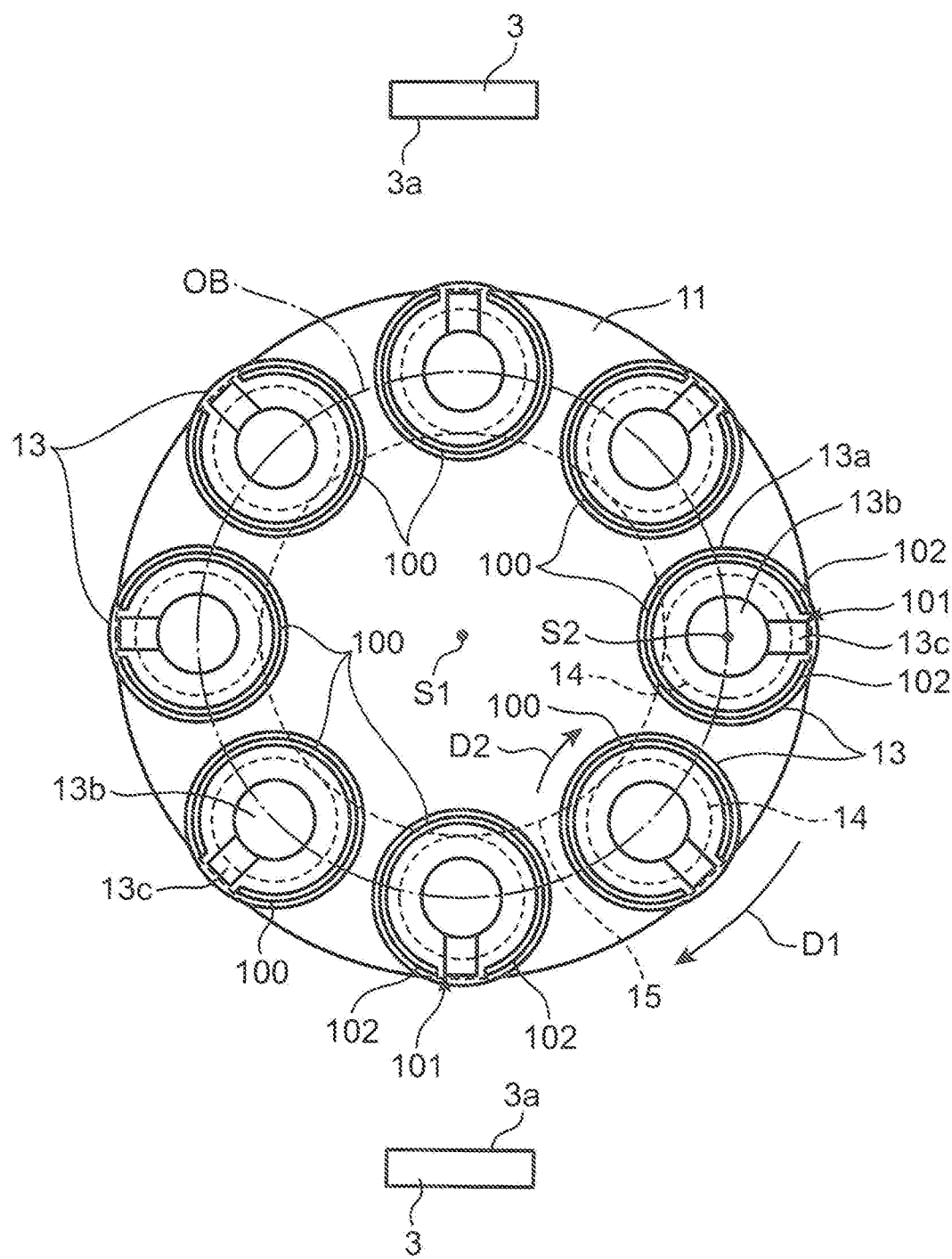
FIG. 2 is a plan view illustrating a disposition of a plurality of works inside a chamber of the coating device illustrated in FIG. 1.

As illustrated in FIGS. 1 and 2, the plurality of targets 3 are mounted on a particular pair of opposing side walls 2a among the plurality of side walls 2a. Each target 3 includes a material for coating the outer circumferential face of the piston ring 100 (for example, titanium or chromium for forming a hard coating of chromium nitride or titanium nitride). Each target 3 has an emission face 3a, and particles of the material come out of the emission face 3a. The target 3 is disposed in the outer side of an orbit-of-revolution OB illustrated in FIG. 2. The piston ring 100 revolves about a predetermined revolution-axis S1 and along the orbit-of-revolution OB.

The arc power source 4 supplies an arc current to the target 3, and the arc current serves as an electrical driving output to cause particles to come out of the target 3. The arc power source 4 includes a cathode and an anode. The cathode is connected to the target 3 and the anode is connected to the chamber 2.

As illustrated in FIG. 2, the piston ring 100, or a work, is a member having a ring shape with a discontinuous portion, namely, an arc shape having a central angle of approximately 360 degrees. That is, the piston ring 100 has a pair of opposing ends 102 and 102 that oppose each other across a space 101, which is the discontinuous portion of the ring. A hard coating is formed on the outer circumferential face of the piston ring 100 by the coating device 1 to prevent wear. The outer circumferential face of the piston ring 100 includes a particular portion where a coating thicker than the other portion is formed. When the piston ring 100 is used inside the cylinder of the engine, the particular portion is subjected to the severest wear inside the cylinder of the engine. That is, the particular portion is the outer circumferential face of the opposing ends 102 and 102.

During the coating processing, the work turning device 5 rotates the plurality of piston rings 100 each about a rotation-axis S2 while moving the piston rings 100 in a predetermined revolving-direction D1.

As illustrated in FIGS. 1 and 2, the work turning device 5 includes, as major components, a plurality of holders 13 and a holder driver 19. Each of the holders 13 can hold a plurality of stacked piston rings 100 and revolve about the rotation-axis S2. The holder driver 19 rotates the holders 13 and revolves the holders 13 in the revolving-direction D1. The revolving-direction D1 is the direction in which the holders 13 revolve about the revolution-axis S1 extending parallel to the rotation-axis S2. The revolving-direction S is different from the extending direction of the rotation-axis S2.

Each holder 13 can rotate about the rotation-axis S2 while holding the plurality of piston rings 100. The holder 13 includes a base 13a on which the stacked piston rings 100 are placed and a pole 13b extending along the rotation-axis S2. The pole 13b has, for example, a column shape and holds from inside the piston rings 100 each stacked to encircle the pole 13b. A rib 13c is provided on the outer circumferential face of the pole 13b. The rib 13c positions the opposing ends 102 and 102 of each piston ring 100. That is, the rib 13c is a positioning part. The rib 13c extends parallel to the rotation-axis S2 and has a width allowing the rib 13c to be inserted in the space 101 between the opposing ends 102 and 102 of each piston ring 100. The rib 13c is inserted in the space 101 as the piston ring 100 is fit on the pole 13b, and thereby the piston ring 100 is positioned such that the opposing ends 102 and 102 of the stacked piston rings 100 face the same predetermined direction with reference to the rotation-axis S2.

The holder driver 19 includes a revolving table 11 that is turnable together with the plurality of holders 13 about the revolution-axis S1, a table driver 12 that turns the revolving table 11, a plurality of rotation gears 14 each rotates with the respective one of the holders 13, a revolution gear 15 that is fixed to the chamber 2 and meshes with the rotation gears 14, and a plurality of connection shafts 17 each interconnecting one of the holders 13 and the respective one of the rotation gears 14.

The table driver 12 includes a motor, and a reducer that reduces the rotation of an output shaft of the motor and transmits the reduced rotation to the revolving table 11.

The revolution gear 15 is fixed to the chamber 2 via a supporting base 18 in such a position that the center of the revolution gear 15 is on the revolution-axis S1.

The revolving table 11 has a plurality of through holes 11a each rotatably holding one of the holders 13. The through holes 11a are disposed around the revolution-axis S1 to be evenly spaced apart. The revolving table 11 includes a table body having a disk shape, and a shaft 16 extending downward along the revolution-axis S1 from the bottom face of the table body. The shaft 16 extends downward from the table body, penetrating a through hole provided in the central portion of the revolution gear 15 and a through hole provided in the central portion of the supporting base 18. The shaft 16 is connected to an output shaft of the reducer (not shown) of the table driver 12. A rotational driving force that the table driver 12 outputs is transmitted to the shaft 16 of the revolving table 11. The transmitted rotational driving force rotates the revolving table 11 about the revolution-axis S1 in the revolving-direction D1 illustrated in FIG. 2 and in the other figures. At the same time, the plurality of holders 13 held on the revolving table 11 revolve about the revolution-axis S1.

The plurality of connection shafts 17 are vertically and rotatably inserted in the plurality of through holes 11a of the revolving table 11. The connection shaft 17 includes a top end connected to the holder 13 and a bottom end connected to the rotation gear 14. With this configuration, the plurality of holders 13 in the upper side of the revolving table 11 and a plurality of the rotation gears 14 in the lower side of the revolving table 11 are rotatably supported together with the connection shafts 17 by peripheral portions of the through holes 11a of the revolving table 11. The holders 13 and the rotation gears 14 are revolved along with the rotating revolving table 11 about the revolution-axis S1 in the revolving-direction D1. Each of the rotation gears 14, meshing with the revolution gear 15, revolves and thereby rotates together with the holder 13 connected to the rotation gear 14 about the rotation-axis S2 in a rotating-direction D2 illustrated in FIG. 2 and in the other figures.

As illustrated in FIG. 2, each of the piston rings 100 held by one of the plurality of holders 13 is positioned such that the opposing ends 102 and 102 of the piston rings 100 face the same predetermined direction with reference to the rotation-axis S2. Therefore, when the holders 13 rotate, the piston rings 100 held by one of the holders 13 can rotate while facing the same direction.

The controlling device 6 includes a period measurement unit 24 that measures the rotation period of the piston ring 100 held by the holder 13, and a controller 23 that controls a current that the arc power source 4 outputs based on the measured period.

The period measurement unit 24 includes a pulse counter 21 and a calculator 22. The pulse counter 21 counts the number of pulses transmitted from the table driver 12 in response to the number of rotations of the motor of the table driver 12 of the work turning device 5. The calculator 22 calculates the rotation period of each piston ring 100 from the number of counted pulses.

The controller 23 generates a control signal for instructing the output level of the arc current corresponding to the rotation period and inputs the control signal to the arc power source 4, thereby controlling the current output from the arc power source 4. The current control will specifically be described in the description on a coating method for coating the piston ring 100 described below.

A method for forming a coated article using the coating device 1 will now be described. In the method, the piston ring 100 is coated by AIP. The method includes a preparation step, a work mounting step, and a coating step.

In the preparation step, the work turning device 5 including the plurality of holders 13, the evaporation source including the target 3, and the coating device 1 including the arc power source 4 as described above are prepared.

In the work mounting step, the plurality of piston rings 100 are mounted on the plurality of holders 13. As illustrated in FIG. 2, the piston rings 100 held by the holders 13 are positioned by the ribs 13c such that the opposing ends 102 and 102 of the piston rings 100 face the same predetermined direction with reference to the rotation-axis S2.

In the coating step, the outer circumferential face of each of the plurality of piston rings 100 is coated while the piston rings 100 are rotated and revolved. Specifically, inside the chamber 2 which is depressurized to a near vacuum, the work turning device 5 rotates the piston rings 100 held by the plurality of holders 13 each about the rotation-axis S2 at a constant rotating-speed while revolving the piston rings 100 about the revolution-axis S1 at a constant revolving-speed.

A bias potential applier (not shown) applies a bias potential to each of the piston rings 100 via the work turning device 5 while the arc power source 4 supplies an arc current to the target 3 made of a material such as chromium. This generates an arc discharge between the target 3 and the inner face of the chamber 2. The arc discharge evaporates the material in the emission face 3a of the target 3 to cause high energy particles to come out of the emission face 3a. The particles collide against the outer circumferential face of the piston ring 100 and form a hard coating, such as chromium nitride, on the outer circumferential face. Each piston ring 100, while rotating and revolving, passes in front of the emission face 3a of the target 3. A hard coating can thus be formed on the entire outer circumferential face of each piston ring 100. The coated article is thus manufactured.

Figure 5:
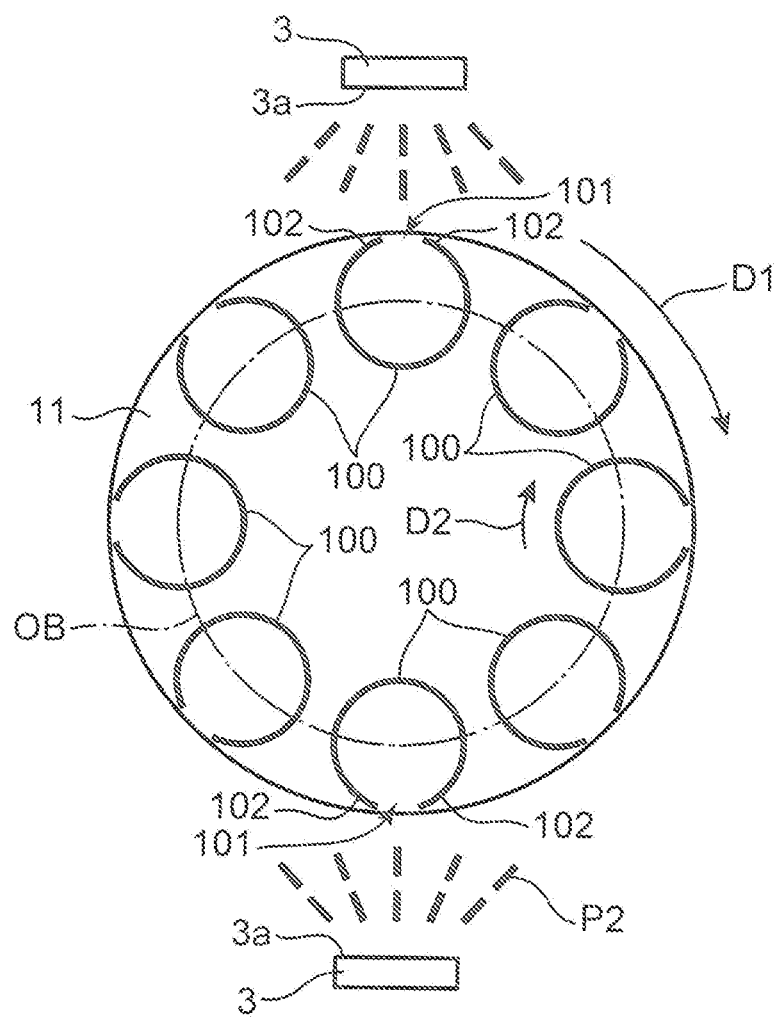
FIG. 5 is a plan view for describing the coating method using the coating device illustrated in FIG. 1.

In the coating step, the controller 23 controls the arc current to cyclically change in accordance with the rotation period of the piston ring 100. The control is performed so as to set the arc current AR, which is a driving output supplied to the target 3, to a current I2 (for example, 150 A) higher than a reference current I1 (for example, 100 A), which is a reference output, only in a particular period. The particular period includes at least a portion of a period in which the opposing ends 102 and 102 of at least one of the plurality of piston rings 100 face the emission face 3a of the target 3, namely, a period in which the opposing ends 102 and 102 face the outer side of the orbit-of-revolution OB as illustrated in FIG. 5. That is, the particular period may be the entire period or a portion of the period in which the opposing ends 102 and 102 face the outer side.

The "reference output" is, for example, the reference current I1 described above, which is a driving output, such as an arc current, necessary for forming a coating having a predetermined target thickness on the entire outer circumferential face of the work, such as the piston ring 100, while rotating the work by the coating device 1.

Figure 3:
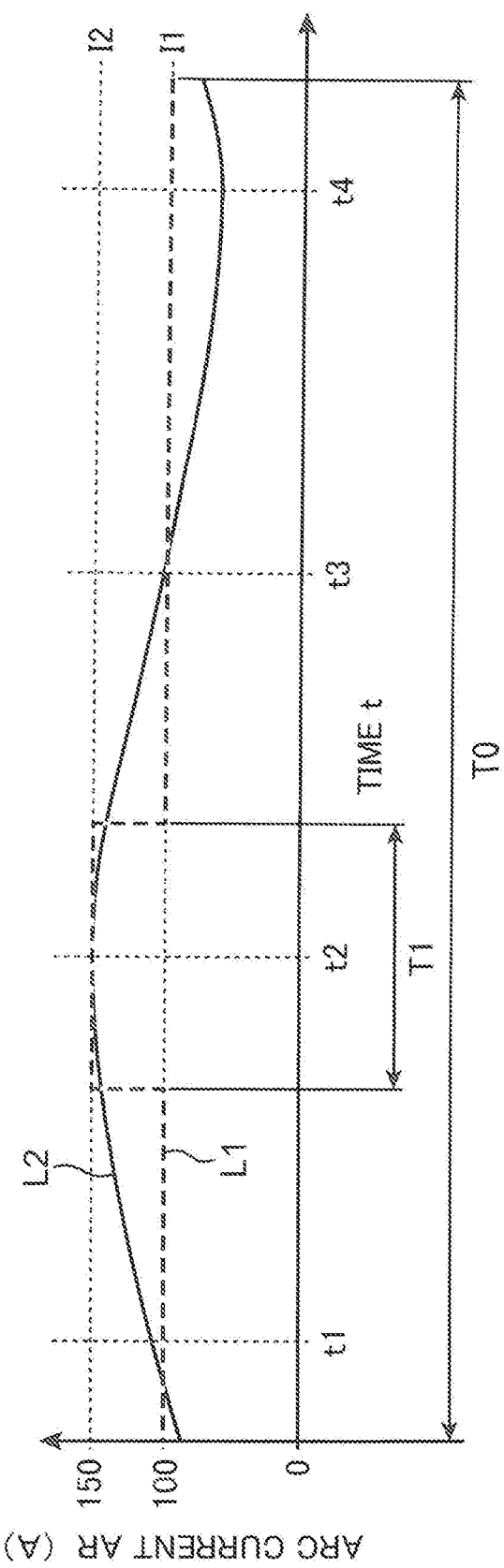
FIG. 3 is a chart illustrating a cyclic change in an arc current AR supplied to a target from an arc power source of the coating device illustrated in FIG. 1.

Specifically, the arc power source 4 is controlled so as to set the arc current AR to the current I2 higher than the predetermined reference current I1 as illustrated in line L1 in FIG. 3 at a time t2 in a rotation period T0 of the piston ring 100 illustrated in FIG. 3. As illustrated in FIG. 5, the time t2 is when the opposing ends 102 and 102 of each of the plurality of piston rings 100 face the outer side of the orbit-of-revolution OB. By such a control, a large number of particles P2 corresponding to the high current I2 is emitted from the emission face 3a of the target 3 to the outer circumferential face of the opposing ends 102 and 102 of the piston ring 100, and a thick coating can partially be formed on the opposing ends 102 and 102 of the piston ring 100 as illustrated in FIG. 5.

Figure 4:
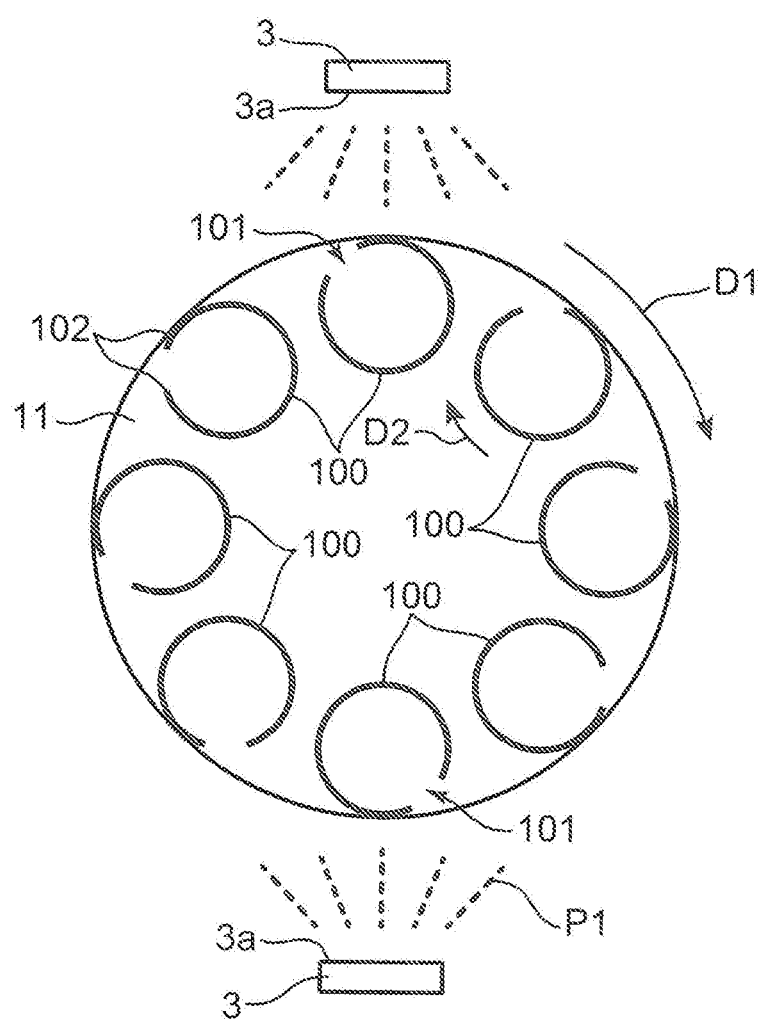
FIG. 4 is a plan view for describing a coating method for coating a piston ring, the coating method using the coating device illustrated in FIG. 1.
Figure 6:
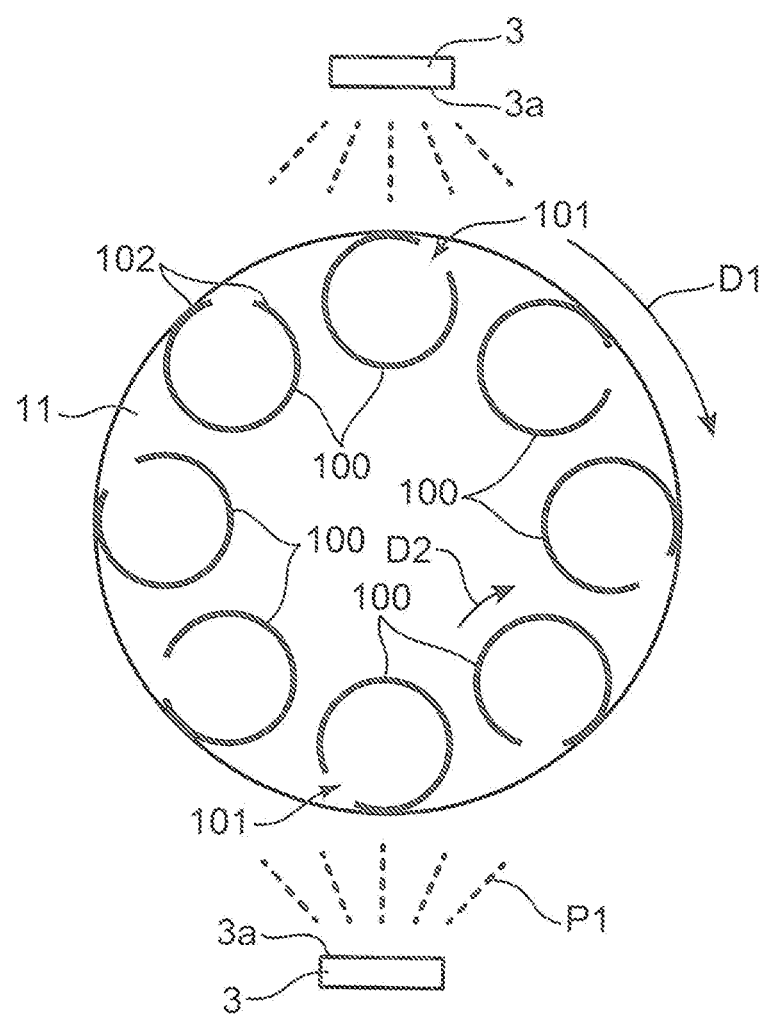
FIG. 6 is a plan view for describing the coating method using the coating device illustrated in FIG. 1.
Figure 7:
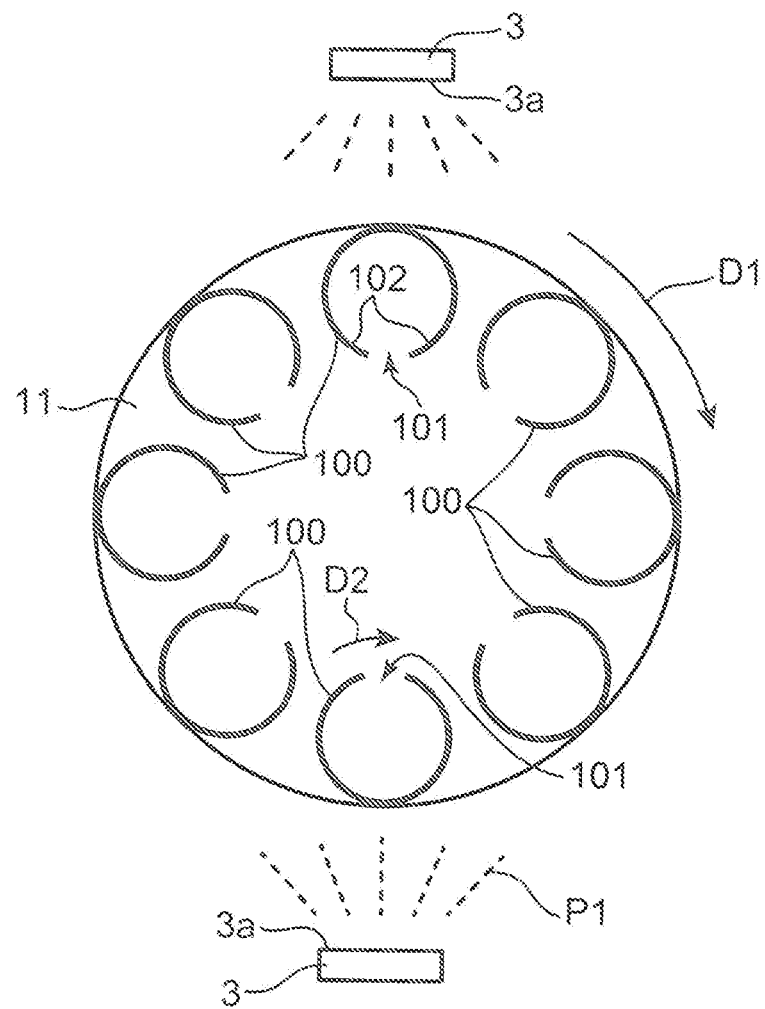
FIG. 7 is an explanatory plan view for describing the coating method using the coating device illustrated in FIG. 1.

As illustrated in line L1 in FIG. 3, the controller 23 controls the arc power source 4 to keep the high current I2 only in a particular period T1, which is a certain period including the time t2, and keep the reference current I1 in the period other than the particular period T1. Therefore, the controller 23 controls the arc power source 4 to set the arc current AR to the reference current I1 at a time t1, which is not in the period T1 as illustrated in FIG. 3 and is when the opposing ends 102 and 102 of the piston ring 100 is not yet facing the outer side of the orbit-of-revolution OB as illustrated in FIG. 4. At the time t1, particles P1 of which amount corresponds to the reference current I1 (smaller than the amount of particles P2 in FIG. 5) are emitted from the emission face 3a of the target 3 and reach a portion of the piston ring 100 other than the opposing ends 102 and 102 to form a coating having a reference thickness on the outer circumferential face of the portion. Similarly, at times t3 and t4 not in the period T1 as illustrated in FIG. 3, the controller 23 controls the arc power source 4 to set the arc current AR to the reference current I1 to emit the particles P1 corresponding to the reference current I1 from the emission face 3a of the target 3. This enables forming a coating having the reference thickness on the outer circumferential face of the portion of the piston ring 100 other than the opposing ends 102 and 102. As illustrated in FIGS. 6 and 7, the times t3 and t4 are when the space 101 between the opposing ends 102 and 102 of the piston ring 100 turns to face the inner side of the orbit-of-revolution after facing the outer side of the orbit-of-revolution.

Alternatively, as illustrated in line L2 in FIG. 3, the controller 23 may control the arc power source 4 so as to set the arc current AR to the maximum current I2 at the time t2 in the rotation period T0 and gradually change continuously and cyclically like a sign curve taking the reference current I1 as an intermediate value. By such a control, like the control performed as illustrated in line L1, a thick coating is partially formed on the outer circumferential face of the opposing ends 102 and 102 of the piston ring 100, and a coating having a thickness close to the reference thickness can be formed on the outer circumferential face of the other portion.

In the coating device 1 of the embodiment and the coating method using the coating device 1 for coating the piston ring 100 (that is, a method for manufacturing a coated article), the coating thickness is controlled not by changing the rotating-speed of the piston ring but by changing the arc current. Specifically, with the piston ring 100 rotating and revolving at a constant rotating-speed and a constant revolving-speed, the controller 23 according to the embodiment controls the arc power source 4 to set the arc current supplied by the arc power source 4 to the target 3 to an output higher than the other period at least in a portion of a period in which the opposing ends 102 and 102 of the piston ring 100 face the emission face 3a of the target 3 (for example, the entire period in which the opposing ends 102 and 102 face the emission face 3a or a portion of such a period). More specifically, the arc power source 4 is controlled to change the arc current cyclically in accordance with the rotation period of the piston ring 100. The work turning device 5 rotates and revolves the piston ring 100 at constant speeds. No control is needed to change the rotating-speed. That is, instead of controlling the rotating-speed, the arc current supplied from the arc power source 4 to the target 3 is changed, which is an electrical operation of high responsiveness. In such a manner, the coating thickness can be controlled with high accuracy and high repeatability to partially form a thick coating on the opposing ends 102 and 102 of the piston ring 100. The coating thickness distribution along the circumferential direction of the piston ring 100 can be controlled with high accuracy. Furthermore, there is no need of changing the rotating-speed and the revolving-speed of the piston ring 100 during the coating processing, and therefore the mechanical load on the work turning device 5 that rotates and revolves the piston ring 100 can be reduced.

However, the present invention is not limited to the embodiment in which the piston ring is rotated and revolved at a constant rotating-speed and a constant revolving-speed. The present invention includes an embodiment in which at least either the rotating-speed or the revolving-speed is changed.

In the embodiment, the rib 13c of each of the holders 13 serves as a positioning part that positions the piston ring 100 so that the opposing ends 102 and 102, which are portions of the outer circumferential face of the piston ring 100 and where a thick coating is to be formed, face a predetermined direction. Namely, the rotational phase of the opposing ends 102 and 102 can be specified. This enables controlling the arc power source 4 when a coating is formed on the outer circumferential face of the piston ring 100 while the piston ring 100 is rotated. That is, the arc current of the target 3 can be controlled to be set to the current I2 higher than the reference current I1 only in the particular period in the rotation period of the piston ring 100, where the particular period is a period or a portion of a period in which the portion including the opposing ends 102 and 102 of the piston ring 100 faces the emission face 3a of the target 3. This control enables partially forming a thick coating on the opposing ends 102 and 102.

Furthermore, in the coating device 1 according to the embodiment and the coating method for coating the piston ring 100, the coating thickness distribution along the circumferential direction of the piston ring 100 can be controlled with high accuracy by controlling the arc power source 4 to change the arc current cyclically in accordance with the rotation period of the piston ring 100.

In the embodiment, the arc power source 4 is controlled to change the arc current cyclically in accordance with the rotation period of the piston ring 100. However, the present invention is not limited to this configuration. The arc current may be changed at a timing not in according with the rotation period, provided that the arc current is increased when the opposing ends 102 and 102 of the piston ring 100 face the emission face 3a of the target 3.

The coating device 1 according to the embodiment and the coating method for coating the piston ring 100 are not limited to a configuration in which the piston ring 100 is moved (for example, revolved) in a predetermined direction different from the extending direction of the rotation-axis S2. Given that the plurality of piston rings 100 held by each one of the holders 13 rotate about the rotation-axis S2 with the opposing ends 102 and 102 of the piston rings 100 in rotational phase, such a control may be performed that the driving output, such as an arc current, of the target 3 in the particular period is set higher than the reference output and a driving output in a period other than the particular period, where the particular period is a period or a portion of the period in which a portion including the opposing ends 102 and 102 of at least one of the piston rings 100 faces the emission face 3a of the target 3. This control enables partially forming a thick coating on the opposing ends 102 and 102 of each of the piston rings 100.

In the coating device 1 according to the embodiment and the coating method for coating the piston ring 100, the rib 13c, which is a positioning part, of each of the plurality of holders 13 of the work turning device 5, positions the plurality of piston rings 100 such that the opposing ends 102 of the piston rings 100 face a predetermined direction with reference to the rotation-axis S2 (for example, the opposing ends 102 of all the piston rings 100 face the revolution-axis S1 or face the outer side of the orbit-of-revolution), where the outer circumferential face of the opposing ends 102 of the piston rings 100 is where a thick coating is to be formed. In such a manner, the opposing ends 102 of the piston rings 100 can correctly be in rotational phase while rotating the piston rings 100. The arc current of the target 3 in the particular period is set to the current I2 higher than the reference current I1, where the particular period is a period or a portion of the period in which the opposing ends 102 and 102 of the piston rings 100 simultaneously face the emission face 3a of the target 3. This enables partially forming a thick coating on the opposing end 102 of each of the piston rings 100. Accordingly, such a coating described above can be formed using a conventional turn table that rotates and revolves the piston ring 100 at a constant turning-speed.

In the coating device 1 according to the embodiment, the target 3 is disposed in the outer side of the orbit-of-revolution along which the holder 13 revolves about the revolution-axis S1, and the controller 23 controls the arc power source 4 to set the arc current of the target 3 in the particular period to the current I2 higher than the reference current I1, where the particular period is a period or a portion of the period in which the opposing ends 102 and 102 of the plurality of piston rings 100 face the outer side of the orbit-of-revolution. This enables forming a thick coating on the opposing end 102 of the piston ring 100 using the target 3 disposed in an arbitrary place in the outer side of the orbit-of-revolution OB of the holder 13.

In the coating device 1 that forms a coating while rotating and revolving the piston ring 100 as in the embodiment, the gear ratio between the rotation gear 14 and the revolution gear 15 preferably takes a non-integer value. When the plurality of piston rings 100 rotate and revolve around the revolution-axis S1, a gear ratio taking such a value causes a change in the circumferential locations, around the revolution-axis S1, where the opposing ends 102 of the piston rings 100 face the outer side of the orbit-of-revolution, the change occurring by every revolution of the piston ring 100. For a small gear ratio, for example, the change occurs by a small step. This change prevents such a state that only the opposing end 102 of a particular piston ring 100, among the piston rings 100, faces the target 3 disposed in the outer side of the orbit-of-revolution OB. Even when the target 3 is disposed in the outer side of the orbit-of-revolution OB, the same coating thickness distribution can be provided to the piston rings 100.

The present invention is not limited to the embodiment described above. For example, the present invention includes the following exemplary modifications.

(A) In the coating device 1 according to the embodiment described above, the power source that supplies an electric driving output to the evaporation source is the arc power source 4 that supplies an arc current to the target 3, which is the evaporation source for AIP. However, the present invention is not limited to such a configuration. The electric driving output according to the present invention may be, for example, a sputtering power for sputtering supplied to an evaporation source.

(B) The work turning device according to the present invention may include at least one holder. The number of the holders is not limited. For example, the work turning device may include a single rotatable holder. In such a case, while the work turning device rotates a work at a constant speed, the controller performs a control to change a driving output, such as an arc current, of the target cyclically in accordance with the rotation period of the work. The driving output is set higher in a particular period than a reference output and the driving output in a period other than the particular period, where the particular period is a period or a portion of the period in which a particular portion of the work faces an emission face of the target. By such a control, a thick coating can partially be formed on the particular portion of the work.

(C) The target 3 according to the embodiment described above is disposed in the outer side of the orbit-of-revolution OB of the holder 13. However, the present invention is not limited to such a configuration. In a first exemplary modification of the present invention as illustrated in FIG. 8, the target 3 may be disposed in the inner side of the orbit-of-revolution OB of the holder 13.

Figure 8:
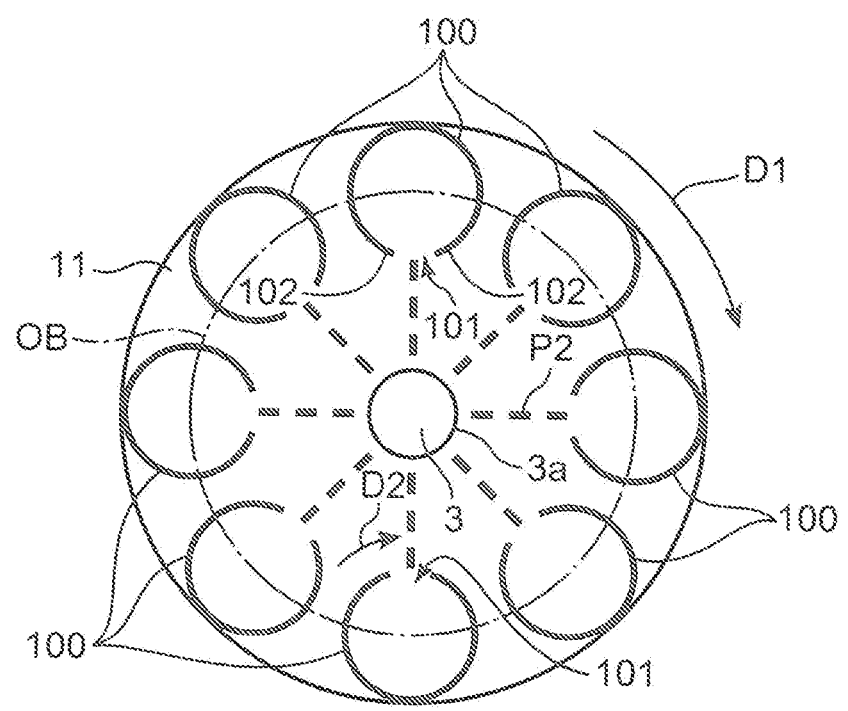
FIG. 8 is a plan view illustrating a coating device according to a first exemplary modification of the present invention, where an evaporation source is disposed inside an orbit-of-revolution of a piston ring.

The target 3 illustrated in FIG. 8 is disposed in the inner side of the orbit-of-revolution such that the emission face 3a faces outward, namely faces the orbit-of-revolution OB. Specifically, the target 3 serving as the evaporation source is disposed on the revolution-axis S1, and the entire outer circumferential face of the target 3 forms a cylindrical shape, facing the radially outer side, and serves as the emission face 3a of the target 3.

Also in the coating device illustrated in FIG. 8, while the piston ring 100 is rotated at a constant rotating-speed and revolved at a constant revolving-speed, a controller similar to the controller 23 illustrated in FIG. 1 performs a control to change the driving output (for example, an arc current) of the target 3 cyclically in accordance with the rotation period of the piston ring 100. The driving output is set higher in a particular period than a reference output and the driving output in a period other than the particular period, where the particular period is a period or a portion of the period in which at least a portion of the opposing ends 102 and 102 (a portion may be the entire portion of the opposing end 102 or a portion of the opposing end 102) of the plurality of piston rings 100 faces the inner side of the orbit-of-revolution OB. In the exemplary modification, a thick coating can be formed by causing a large number of the particles P2 to partially hit the end 102 of each of the piston rings 100 using a single target 3 disposed in the inner side of the orbit-of-revolution OB of the holder 13.

With the emission face 3a of the target 3 of the coating device illustrated in FIG. 8 surrounding the entire circumference of the revolution-axis S1 and facing the radially outer side in directions away from the revolution-axis S1, a large number of the particles P2 coming out of the emission face 3a can hit the opposing ends 102 of the plurality of piston rings 100 at a time by increasing the driving output of the target 3 when the portions including the opposing ends 102 of the piston rings 100 face the inner side of the orbit-of-revolution OB. In such a manner, a thick coating can efficiently be formed on the opposing ends 102 of the piston rings 100 using a single target 3.

If the coating device illustrated in FIG. 8 includes a holder, a rotation gear, and a revolution gear respectively similar to the holder 13, the rotation gear 14 that rotates and revolves together with the holder 13, and the revolution gear 15 fixed to the chamber illustrated in FIGS. 1 and 2, the ratio between the rotation gear and the revolution gear preferably takes a non-integer number. A gear ratio taking such a value causes a small change in the circumferential locations, around the revolution-axis S1, where the opposing ends 102 of the plurality of piston rings 100 face the inner side of the orbit-of-revolution, the change occurring by every revolution of the piston ring 100 around the revolution-axis. This change prevents such a state that only the opposing end 102 of a particular piston ring 100, among the piston rings 100, faces the target 3 disposed in the inner side of the orbit-of-revolution. Even when the target 3 is disposed in the inner side of the orbit-of-revolution (in particular, when the target 3 has a flat emission face 3a as illustrated in FIG. 3), the same coating thickness distribution can be provided to the piston rings 100.

(D) In the coating device 1 according to the embodiment and the coating method for coating a piston ring, a coating is formed on the outer circumferential face of each of the plurality of piston rings 100 while the piston rings 100 are rotated and revolved by the work turning device 5. However, the present invention is not limited to such a configuration. As in a coating device illustrated in FIG. 9, in a second exemplary modification of the present invention, a coating may be formed on the outer circumferential face of each of the piston rings 100 while rotating and straightly moving the piston rings 100.

Figure 9:
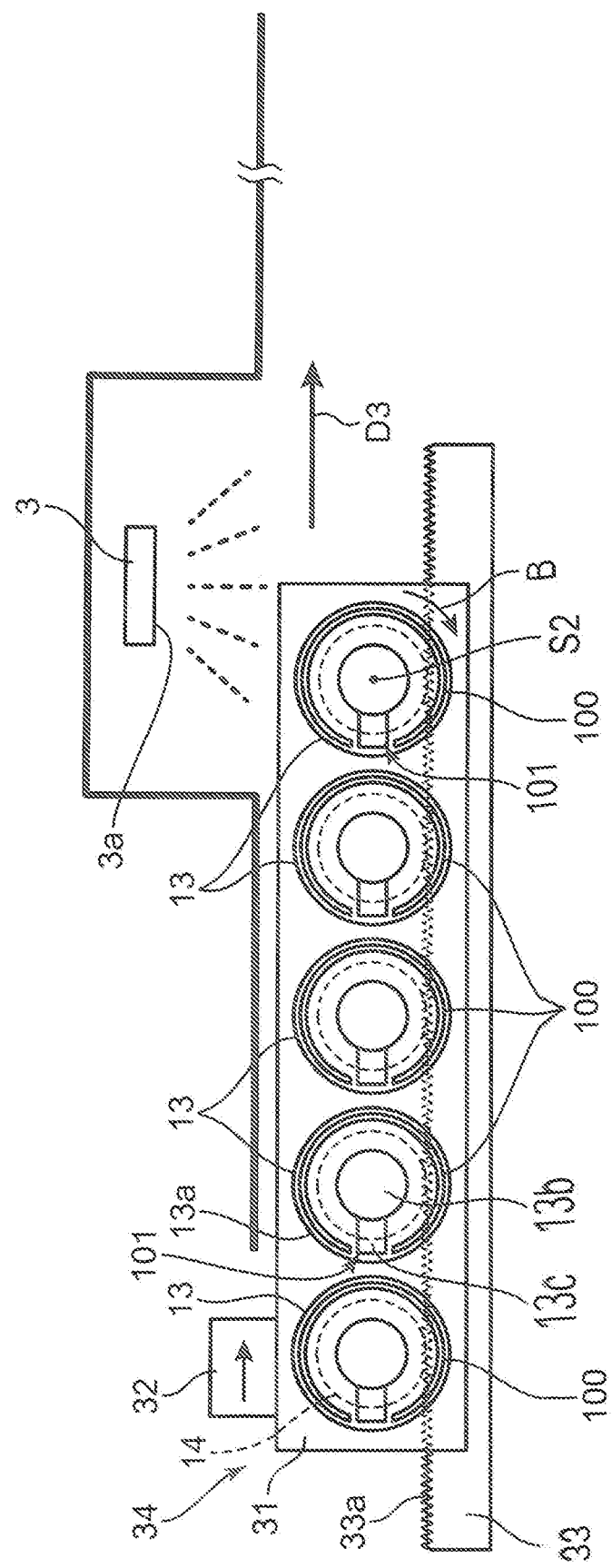
FIG. 9 is a plan view illustrating a disposition of a plurality of works inside a chamber of a coating device according to a second exemplary modification of the present invention, where piston rings are rotated while being straightly moved.

The coating device illustrated in FIG. 9 includes a work turning device 34. The work turning device 34 includes a plurality of rotatable holders 13, and a holder driver that rotates the holders 13 each about the rotation-axis S2 at a constant rotating-speed while moving the holders 13 in a straight direction D3 perpendicular to the extending direction of the rotation-axis S2.

Specifically, the holder driver includes a plurality of rotation gears 14 rotatable together with the plurality of holders 13, a slide member 31 that is movable in the straight direction D3 while rotatably supporting the holders 13 and the rotation gears 14, a linear driver 32 that moves the slide member 31 in the straight direction D3, and a rack 33 having a plurality of teeth 33a that mesh with the rotation gears 14.

Similar to the holders 13 illustrated in FIGS. 1 and 2, each of the holders 13 includes a base 13a, a pole 13b, and a rib 13c serving as a positioning part that positions the opposing end 102 of the piston ring 100.

The slide member 31 rotatably supports the plurality of holders 13 and the plurality of rotation gears 14. For example, similar to the revolving table 11 illustrated in FIG. 1, the slide member 31 has a plurality of through holes (not shown) for rotatably supporting the holders 13 and the rotation gears 14. The through holes are disposed separated from each other to be lined along the straight direction D3 in which the holders 13 are moved. Similar to the revolving table 11, connection shafts (not shown) each interconnecting one of the holders 13 and one of the rotation gears 14 are rotatably inserted in the through holes. Each connection shaft allows the holder 13 and the rotation gear 14 connected to the holder 13 to rotate in the rotating-direction D2.

The rib 13c of each of the plurality of holders 13 positions the piston rings 100 such that the opposing ends 102 and 102 of the piston rings 100 face the same predetermined direction with reference to the rotation-axis S2.

The linear driver 32 includes a unit that drives the slide member 31 in a straight direction, for example, a linear mechanism with a combination of a rack and a pinion gear, an air cylinder, or a linear motor.

The plurality of teeth 33a of the rack 33 are disposed to line along the straight direction D3. The plurality of rotation gears 14 mesh with the teeth 33a of the rack 33. Each rotation gear 14 moving in the straight direction D3 receives a rotational driving force from the teeth 33a of the rack 33 to rotate. Accordingly, the rotation gear 14 and the holder 13 connected to the rotation gear 14 can rotate and move straightly at the same time.

The target 3 is disposed in a location out of a path along which the plurality of holders 13 move in the straight direction D3. The emission face 3a of the target 3 is directed in the direction to face the holder 13 that moves along the path.

Other parts of the configuration of the coating device illustrated in FIG. 9 are the same as those of the coating device 1 illustrated in FIGS. 1 and 2. Description on the other parts of the configuration will be omitted.

A method for forming a coating on the plurality of piston rings 100 using the coating device illustrated in FIG. 9 includes a step of preparing the coating device, a work mounting step, and a coating step.

Similar to the coating device 1 illustrated in FIGS. 1 and 2, the plurality of piston rings 100 are mounted on the plurality of holders 13 in the work mounting step. As illustrated in FIG. 9, the piston rings 100 are positioned such that the opposing ends 102 and 102 of the piston rings 100 face the same predetermined direction with reference to the rotation-axis S2 (for example, the direction perpendicular to the straight direction C of the piston ring 100).

In the coating step, the work turning device 34 rotates the plurality of piston rings 100 each about the rotation-axis S2 at a constant rotating-speed while straightly moving the piston rings 100 in the direction D3 perpendicular to the rotation-axis S2 at a constant speed. A controller included in the coating device and configured like the controller 23 illustrated in FIG. 1 performs a control to change the driving output (for example, an arc current) of the target 3 cyclically in accordance with the rotation period of the piston ring 100. The driving output is set higher in a particular period than a reference output and the driving output in a period other than the particular period, where the particular period is a period or a portion of the period in which a region including the opposing ends 102 and 102 of at least one of the piston rings 100 straightly moving as described above faces the emission face 3a of the target 3. The outer circumferential face of the piston ring 100 is thereby coated.

In the coating step as illustrated in FIGS. 10 to 13, for example, the outer circumferential face of the piston ring 100 is coated while the piston ring 100 rotates and moves in the straight direction D3.

Figure 10:
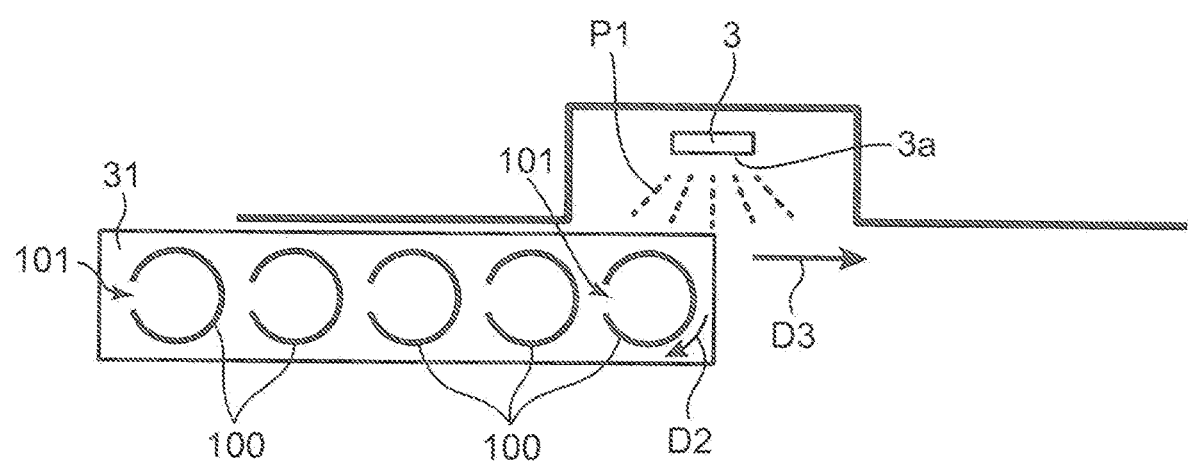
FIG. 10 is a plan view for describing a coating method for coating a piston ring, the coating method using the coating device illustrated in FIG. 9.

As illustrated in FIG. 10, in a period before the space 101 between the opposing ends 102 and 102 of each of the plurality of piston rings 100 faces the emission face 3a of the target 3 (in FIG. 10, the period in which the space 101 faces leftward), the controller controls the arc power source 4 to set the arc current AR to the reference current I1 as in the coating device 1 in FIG. 1. In this period, the target 3 emits the particles P1 corresponding to the reference current I1 from the emission face 3a. The particles P1 arrive at a portion other than the opposing ends 102 and 102 of each piston ring 100 and a coating having a reference thickness is formed on the outer circumferential face of a portion other than the opposing ends 102 and 102.

Figure 11:
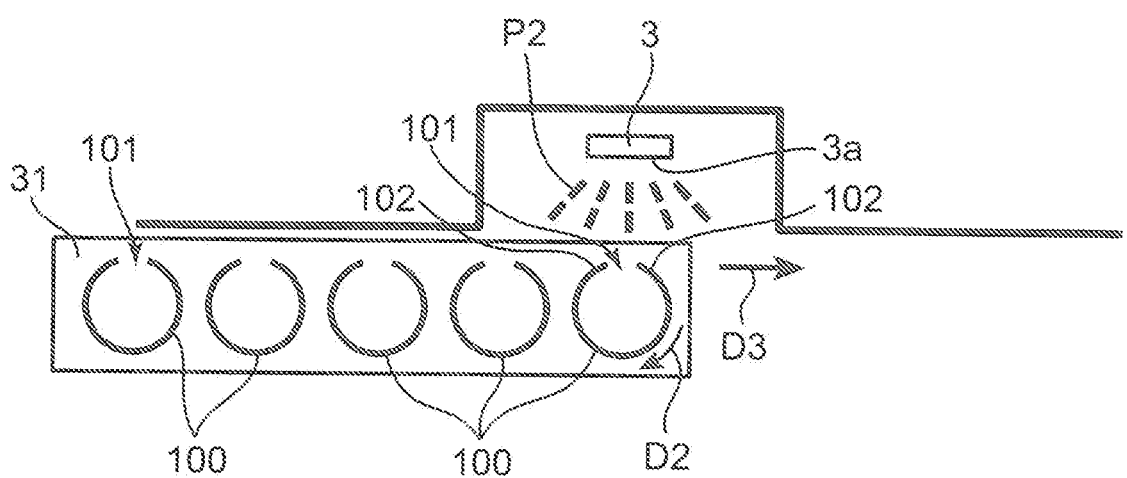
FIG. 11 is a plan view for describing the coating method using the coating device illustrated in FIG. 9.

Meanwhile, as illustrated in FIG. 11, in a particular period, which is a period or a portion of the period in which the opposing ends 102 and 102 of the plurality of piston rings 100 face the emission face 3a of the target 3 (in FIG. 11, the period in which the space 101 faces upward), the controller controls the arc power source 4 to set the arc current AR to the current I2 higher than the reference current I1. In such a manner, the target 3 emits a large number of particles P2 corresponding to the high current I2 from the emission face 3a. The particles P2 arrive at the outer circumferential face of the opposing end 102 of the piston ring 100 to partially form a thick coating on a portion of the outer circumferential face.

Figure 12:
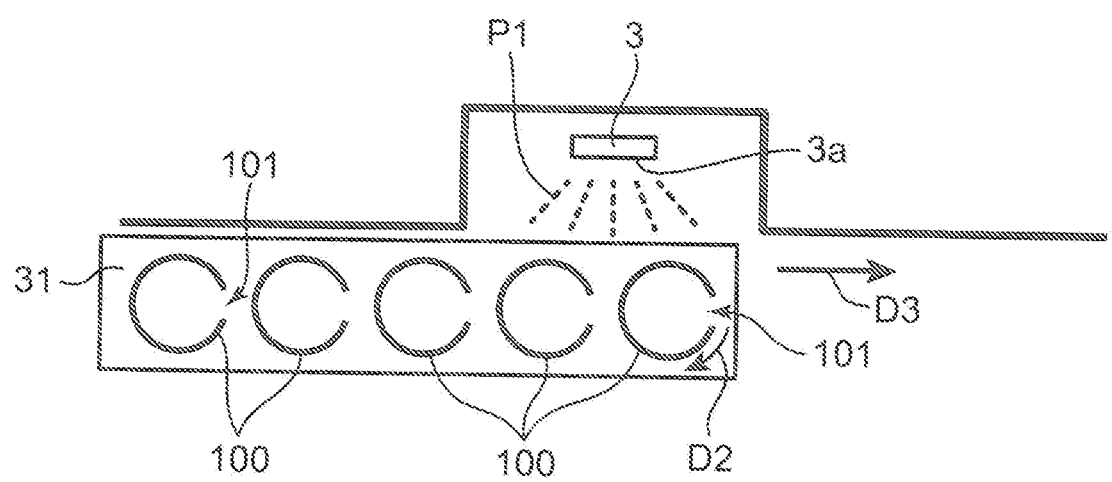
FIG. 12 is a plan view for describing the coating method using the coating device illustrated in FIG. 9.
Figure 13:
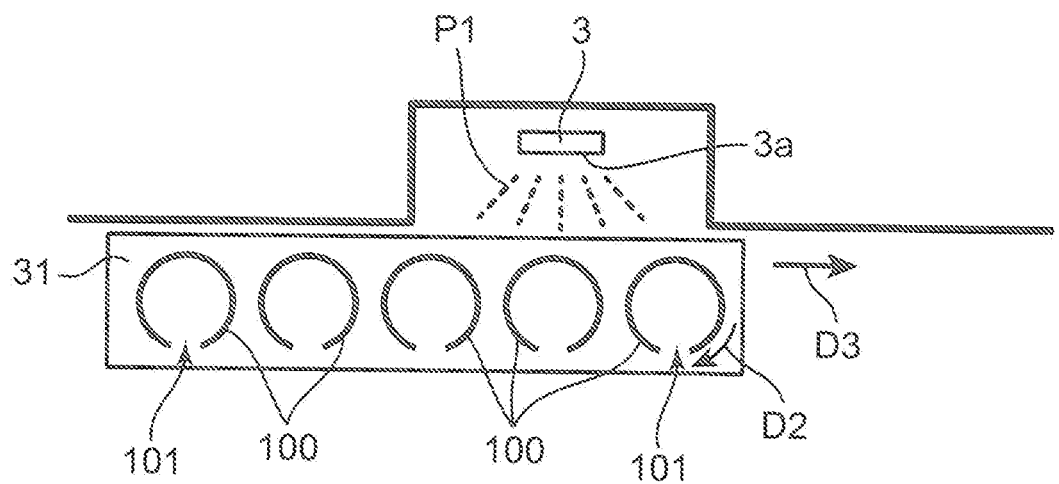
FIG. 13 is a plan view for describing the coating method using the coating device illustrated in FIG. 9.

As illustrated in FIGS. 12 and 13, in a period after the period in which the opposing ends 102 and 102 of the piston rings 100 face the emission face 3a (in FIGS. 12 and 13, the period in which the opposing ends 102 and 102 face rightward or downward after the particular period), the controller controls the arc power source 4 to set the arc current AR to the reference current I1 as in the period illustrated in FIG. 10. In such a manner, the target 3 emits particles P1 corresponding to the reference current I1 from the emission face 3a to form a coating having the reference thickness on the outer circumferential face of a portion other than the opposing ends 102 and 102 of the piston ring 100.

In the coating device illustrated in FIGS. 9 to 13, the outer circumferential face of each of the plurality of piston rings 100 passing in front of the emission face 3a of the target 3 is coated while the piston rings 100 are rotated at a constant rotating-speed and moved in the straight direction D3 perpendicular to the extending direction of the rotation-axis S2 by the revolving table 11. A thick coating can thereby be partially formed on the opposing ends 102 and 102 of the piston rings 100. Accordingly, such a coating described above can be formed using a conventional work moving table that rotates a work at a constant rotating-speed while straightly moving the work at a constant speed.

The work turning device 34 of the coating device illustrated in FIGS. 9 to 13 rotates the plurality of piston rings 100 while moving the piston rings 100 in the straight direction D3. However, the present invention is not limited to such a configuration. For example, the piston rings 100 may be moved not only in the straight direction D3 but in both directions, namely, in the straight direction D3 and the opposite direction to reciprocate the piston rings 100.

(E) A work according to the present invention is not limited to a piston ring. The coating device according to the present invention and the method for manufacturing a coated article can widely be used for a work having an outer circumferential face that is to be coated and having a determined particular portion that is to be provided with a thick coating. For example, if a work is a chip of a single-point tool used for cutting, a portion of the outer circumferential face of the chip of a single-point tool that contacts and cuts a material spinning at a high speed (that is, a cutting face) may be determined as a particular portion where a thick coating is to be formed.

As described above, a coating device that can control the coating thickness distribution along the circumferential direction of a work is provided.

Provided is a coating device including a chamber, a work turning device that is housed in an inside of the chamber and includes at least one holder that holds at least one work and rotates the work about a predetermined rotation-axis, the work having an outer circumferential face on which a coating is to be formed, an evaporation source attached to the inside of the chamber and having an emission face from which particles come out as a material of a coating formed on the outer circumferential face of the work, a power source that supplies an electric driving output to the evaporation source to cause the particles to come out of the emission face, and a controller that controls the power source, while the work turning device rotates the work, to set the driving output supplied by the power source to the evaporation source in a particular period to an output higher than a reference output and a driving output in a period other than the particular period, the particular period being at least a portion of a period in which a particular portion of the outer circumferential face of the work faces the emission face of the evaporation source, the particular portion being where a coating thicker than the other portion of the outer circumferential face of the work is to be formed.

In the coating device, instead of changing the rotating-speed of a work as in a conventional coating device, an electric driving output supplied from a power source to an evaporation source (for example, an arc current for an arc evaporation source or a sputtering power for a sputtering evaporation source) is controlled. Specifically, a controller controls the power source to set the driving output to a high output when the particular portion, where a thick coating is to be formed, of the outer circumferential face of the work faces the emission face of the evaporation source. Thus, the work turning device only needs to rotate the work at a constant speed and no control is needed to change the rotating-speed. Instead of controlling the rotating-speed, the electric driving output supplied from the power source to the evaporation source is changed to partially form a thick coating on a particular portion of the work. Since this change is made electrically, which means the response is quick, the coating thickness can be controlled with high accuracy and with high repeatability. Thus, the coating thickness distribution along the circumferential direction of the work can be controlled with high accuracy. Since there is no need to change the rotating-speed of the work during the coating processing, a mechanical load on the work turning device that rotates the work can be reduced.

The "reference output" is a driving output necessary for forming a coating having a predetermined target thickness on the entire outer circumferential face of the work while the work is rotated by the coating device.

It is preferable that the coating device further includes a period measurement unit that measures the rotation period of the work held by the holder, and the controller controls the power source to change the driving output cyclically in accordance with the rotation period of the work.

By the controller controlling the power source to change the driving output cyclically in accordance with the rotation period of the work, the coating thickness distribution along the circumferential direction of the work can be controlled with high accuracy.

It is preferable that at least one work includes a plurality of works, and the at least one holder includes a plurality of holders each holding one of the works. The work turning device further includes a holder driver that rotates the holders each about the rotation-axis while moving the holders in a predetermined direction different from the extending direction of the rotation-axis. While the holder driver of the work turning device moves the holders, the controller controls a driving output of the evaporation source in the particular period to be set higher than a reference output and the driving output in a period other than the particular period, where the particular period is at least a portion of a period in which the particular portion of at least one of the works faces the emission face of the evaporation source.

In the coating device, the holder driver rotates the plurality of works at a constant rotating-speed while moving the works in the predetermined direction at a constant speed, and the driving output of the evaporation source in the particular period is controlled to be set higher than the reference output and the driving output in the period other than the particular period, where the particular period is at least a portion of the period in which a portion including a particular portion of at least one of the works faces the emission face of the evaporation source. By combining the rotation and movement of the works with the controlling of the driving output, a thick coating can partially be formed on the particular portion of each of the works.

If at least one work includes a plurality of works and the at least one holder includes a plurality of holders each holding the works, it is preferable that, while the work turning device rotates the works each about the rotation-axis with the particular portions of the works held by the holders in rotational phase, the driving output of the evaporation source in the particular period is controlled to be set higher than the reference output and the driving output in a period other than the particular period, where the particular period is at least a portion of a period in which the particular portion of at least one of the works faces the emission face of the evaporation source.

As described above, when the plurality of works held by the plurality of holders are rotated at a constant rotating-speed with the particular portions of the works in rotational phase, the driving output of the evaporation source in the particular period is set higher than the reference output, where the particular period is at least a portion of the period in which the portion including a particular portion of at least one of the works faces the emission face of the evaporation source. This enables partially forming a thick coating on the particular portions of the works.

Each of the plurality of holders preferably includes a positioning part that positions the work such that the particular portion faces a predetermined direction with reference to the rotation-axis.

The positioning part positions the plurality of works such that the particular portion, on which a thick coating is formed, of the outer circumferential face of each of the works faces the same predetermined direction with reference to the rotation-axis. This enables accurately synchronizing the rotational phases of the particular portions while rotating the works.

The holder driver is preferably configured to rotate each of the plurality of holders about the rotation-axis while revolving the holders about the revolution-axis extending parallel to the extending direction of the rotation-axis.

While the holder driver rotates the plurality of works while revolving the works about the revolution-axis, a coating is formed on the outer circumferential face of each of the works passing in front of the emission face of the evaporation source. In this manner, a thick coating can partially be formed on the particular portion of each of the works. Accordingly, such a coating described above can be formed using a conventional turn table that rotates and revolves the works at a constant turning-speed.

If the evaporation source is disposed in the outer side of the orbit-of-revolution of the holders revolving about the revolution-axis, it is preferable that, while the holder driver of the work turning device rotates the works each about the rotation-axis while revolving the works about the revolution-axis, the controller controls the driving output of the evaporation source in the particular period to be set higher than the reference output and the driving output in a period other than the particular period, where the particular period is at least a portion of a period in which a portion including the particular portions of the works faces the outer side of the orbit-of-revolution.

In such a manner, the power source is controlled to set the driving output of the evaporation source in the particular period to be higher than the reference output, where the particular period is at least a portion of a period in which the portion including the particular portions of the plurality of works faces the outer side of the orbit-of-revolution. This enables forming a thick coating on the particular portion of the work using the evaporation source disposed in an arbitrary place in the outer side of the orbit-of-revolution of the holder.

The evaporation source may be disposed in the inner side of the orbit-of-revolution of the holder revolving about the revolution-axis, and the emission face may be disposed in the inner side of the orbit-of-revolution to face the orbit-of-revolution. In such a case, it is preferable that, while the holder driver of the work turning device rotates the works each about the rotation-axis while revolving the works about the revolution-axis, the controller controls the driving output of the evaporation source in the particular period to be set higher than the reference output and the driving output in a period other than the particular period, where the particular period is at least a portion of a period in which the portion including the particular portions of the works faces the inner side of the orbit-of-revolution.

In such a manner, the power source is controlled to set the driving output of the evaporation source in the particular period to be set higher than the reference output and the driving output in the period other than the particular period, where the particular period is at least a portion of the period in which the portion including the particular portions of the works faces the inner side of the orbit-of-revolution. This enables forming a thick coating on the particular portions of the works using the evaporation source disposed in the inner side of the orbit-of-revolution of the holder.

The work turning device further includes a plurality of rotation gears each connected to the respective one of the plurality of holders and rotatable together with the holder about the rotation-axis, and a revolution gear that meshes with each of the rotation gears and is fixed to the inside of the chamber such that the revolution-axis runs through the center of the revolution gear. The gear ratio between the rotation gear and the revolution gear preferably takes a non-integer value.

The gear ratio between the rotation gear that rotates and revolves with the holder and the revolution gear fixed to the chamber taking a non-integer value causes a change in the circumferential locations, around the revolution-axis, where the particular portions of the plurality of works face the outer side or the inner side of the orbit-of-revolution by every revolution of the works around the revolution-axis. This change prevents such a state that only the particular portion of a particular work, among the works, faces the evaporation source disposed in the outer side or the inner side of the orbit-of-revolution. Even when the evaporation source is disposed in the outer side or the inner side of the orbit-of-revolution, the same coating thickness distribution can surely be obtained for the works.

The holder driver may be configured to rotate the holders each about the rotation-axis while straightly moving the holders in a direction perpendicular to the extending direction of the rotation-axis.

Such a configuration can also form a coating on the outer circumferential face of the work passing in front of the emission face of the evaporation source. This enables forming a thick coating partially on the particular portion of each of the works. Accordingly, such a coating described above can be formed using a conventional work moving table that rotates a work at a constant rotating-speed while straightly moving the work at a constant speed.

Also provided is a method for manufacturing a coated article, the method including a preparation step of preparing a work turning device that includes at least one holder that holds at least one work having an outer circumferential face where a coating is to be formed and rotates the work about a predetermined rotation-axis, an evaporation source having an emission face from which particles come out as a material of a coating formed on the outer circumferential face of the work, and a power source that supplies an electric driving output to the evaporation source to cause the particles to come out of the emission face, a work mounting step of mounting the work on the holder, and a coating step of forming a coating on the outer circumferential face of the work, while rotating the work by the work turning device, by controlling the power source so as to set the driving output in a particular period to be higher than a reference output and a driving output in a period other than the particular period, the particular period being at least a portion of a period in which a particular portion of the outer circumferential face of the work faces the emission face of the evaporation source, the particular portion being where a coating thicker than the other portion is to be formed, the work being formed into a coated article.

According to the method for manufacturing a coated article, instead of changing the rotating-speed of the work as in a conventional method, the driving output is controlled in the coating step to be higher in the particular period which is at least a portion of a period in which a particular portion, on which a thick coating is to be formed, of the outer circumferential face of the work faces the emission face of the evaporation source. This enables accurately controlling the coating thickness distribution along the circumferential direction of the work without changing the rotating-speed of the work. Accordingly, the work needs to be rotated at a constant speed but no control is needed to change the rotating-speed. Instead of controlling the rotating-speed, the electric driving output supplied from the power source to the evaporation source is changed to partially form a thick coating on the particular portion of the work. Since this change is made electrically, which means the response is quick, the coating thickness can be controlled with high accuracy and with high repeatability. Thus, the coating thickness distribution along the circumferential direction of the work can be controlled with high accuracy. Since there is no need to change the rotating-speed of the work during the coating processing, a mechanical load on the work turning device that rotates the work can be reduced.

In the coating step, it is preferable to control the driving output to change cyclically in accordance with the rotation period of the work.

By controlling the driving output to change cyclically in accordance with the rotation period of the work, the coating thickness distribution along the circumferential direction of the work can be controlled with high accuracy.

In the coating step, it is preferable that, while the work turning device rotates the plurality of works each about the rotation-axis while moving the works in the predetermined direction different from the extending direction of the rotation-axis, the driving output of the evaporation source in the particular period is controlled to be set higher than the reference output and the driving output in the period other than the particular period, where the particular period is at least a portion of a period in which the particular portion of at least one of the works faces the emission face of the evaporation source.

According to the method, a thick coating can partially be formed on the particular portion of each of the works.

In the coating step, it is preferable that, while the work turning device rotates the works each about the rotation-axis with the particular portions of the works in rotational phase, the driving output of the evaporation source in the particular period is controlled to be set higher than the reference output and the driving output in the period other than the particular period, where the particular period is at least a portion of a period in which the particular portion of at least one of the works faces the emission face of the evaporation source.

According to the method, a thick coating can partially be formed on the particular portion of each of the works.

In the work mounting step, it is preferable that the works are mounted on the holders such that the particular portions face a predetermined direction with reference to the rotation-axis.

According to the method, the particular portions of the plurality of rotating works can be in rotational phase.

To form a coating on the outer circumferential face of the work in the coating step, it is preferable that, while the work turning device rotates the works each about the rotation-axis while revolving the works about the revolution-axis extending parallel to the extending direction of the rotation-axis, the driving output of the evaporation source in the particular period is controlled to be set higher than the reference output and the driving output in the period other than the particular period, where the particular period is at least a portion of a period in which the particular portion of at least one of the works faces the emission face of the evaporation source.

By this method, such a coating described above can be formed using a conventional turn table that rotates and revolves the works at a constant turning-speed.

In the coating step, a coating may be formed on the outer circumferential face of the work in such a manner that, while the work turning device rotates the works each about the rotation-axis while straightly moving the works in the direction perpendicular to the rotation-axis, the driving output of the evaporation source in the particular period is controlled to be set higher than the reference output and the driving output in the period other than the particular period, where the particular period is at least a portion of a period in which the particular portion of at least one of the works faces the emission face of the evaporation source.

According to the method, such a coating described above can be formed using a conventional work moving table that rotates the works at a constant rotating-speed while straightly moving the works at a constant speed.

The invention claimed is:

1. A coating device comprising:
   a chamber;
   a work turning device that is housed in an inside of the chamber and includes at least one holder that holds at least one work and rotates the work about a predetermined rotation-axis, the work having an outer circumferential face on which a coating is to be formed;
   an evaporation source attached to the inside of the chamber and having an emission face from which particles come out as a material of a coating formed on the outer circumferential face of the work;
   a power source that supplies an electric driving output to the evaporation source to cause the particles to come out of the evaporation source; and a controller that controls the power source, while the work turning device rotates the work, to set the electric driving output supplied by the power source to the evaporation source in a particular period to an output higher than a reference output and an output in a period other than the particular period, the particular period being at least a portion of a period in which a particular portion of the outer circumferential face of the work faces the emission face of the evaporation source, the particular portion being where a coating thicker than a second portion of the outer circumferential face of the work is to be formed.

2. The coating device according to claim 1, further comprising
a period measurement unit that measures a rotation period of the work held by the at least one holder, wherein
the controller controls the power source to change the electric driving output cyclically in accordance with the rotation period of the work.

3. The coating device according to claim 1, wherein
the at least one work is one of a plurality of works, each of the plurality of works includes the particular portion where the coating thicker than the second portion of the outer circumferential face of the respective work is to be formed, the at least one holder includes a plurality of holders holding the plurality of works, the work turning device further includes a holder driver that rotates the plurality of holders each about the rotation-axis while moving the plurality of holders in a predetermined direction different from an extending direction of the rotation-axis, and, while the holder driver of the work turning device moves the plurality of works, the controller controls the electric driving output of the evaporation source in the particular period for each work of the plurality of works to be set higher than the reference output and the electric driving output in the period other than the particular period.

4. The coating device according to claim 1, wherein the at least one work is one of a plurality of works, each of the plurality of works includes the particular portion where the coating thicker than the second portion of the outer circumferential face of the respective work is to be formed, the at least one holder includes a plurality of holders holding the plurality of works, and, while the work turning device rotates the plurality of works held by the plurality of holders each about the rotation-axis with the particular portions of the works in rotational phase, the controller controls the electric driving output of the evaporation source in the particular period for each work of the plurality of works to be set higher than the reference output and the electric driving output in the period other than the particular period.

5. The coating device according to claim 3, wherein
each of the plurality of holders includes a positioning part that positions the plurality of works such that the particular portion of each work of the plurality of works faces a predetermined direction with reference to the rotation-axis.

6. The coating device according to claim 3, wherein
the holder driver is configured to rotate the plurality of holders each about the rotation-axis while revolving the plurality of holders about a revolution-axis extending parallel to the extending direction of the rotation-axis.

7. The coating device according to claim 6, wherein the evaporation source is disposed in an outer side of an orbit-of-revolution of the holder revolving about the revolution-axis, and, while the holder driver of the work turning device rotates each work of the plurality of works about the rotation-axis while revolving each work of the plurality of works about the revolution-axis, the controller controls the electric driving output of the evaporation source in the particular period for each work of the plurality of works to be set higher than the reference output and the electric driving output in the period other than the particular period, the particular period being at least the portion of the period in which the region including the particular portion for each respective work of the plurality of works faces the outer side of the orbit-of-revolution.

8. The coating device according to claim 6, wherein
the evaporation source is disposed in an inner side of an orbit-of-revolution of the holder revolving about the revolution-axis, the emission face in the inner side of the orbit-of-revolution faces the orbit-of-revolution, and, while the holder driver of the work turning device rotates the work about the rotation-axis while revolving the work about the revolution-axis, the controller controls the electric driving output of the evaporation source in the particular period for each work of the plurality of works to be set higher than the reference output and the electric driving output in the period other than the particular period, the particular period being at least the portion of the period in which the particular portion for each respective work of the plurality of works faces the inner side of the orbit-of-revolution.

9. The coating device according to claim 6, wherein
the work turning device further includes a plurality of rotation gears each connected to one of the plurality of holders and rotatable together with the holder about the rotation-axis, and a revolution gear that meshes with each of the plurality of rotation gears and is fixed to the inside of the chamber such that the revolution-axis runs through a center of the revolution gear, and a gear ratio between the rotation gear and the revolution gear takes a non-integer value.

10. The coating device according to claim 3, wherein
the holder driver is configured to rotate the plurality of holders each about the rotation-axis while straightly moving the plurality of holders in a direction perpendicular to the extending direction of the rotation-axis.

* * * * *